US010403575B2

(12) United States Patent
Herdt et al.

(10) Patent No.: US 10,403,575 B2
(45) Date of Patent: Sep. 3, 2019

(54) INTERCONNECT STRUCTURE WITH NITRIDED BARRIER

(71) Applicant: Micron Technology, Inc., Boise, ID (US)

(72) Inventors: Gregory C. Herdt, Boise, ID (US); Mikhail A. Treger, Boise, ID (US); Jin Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 15/405,711

(22) Filed: Jan. 13, 2017

(65) Prior Publication Data

US 2018/0204803 A1 Jul. 19, 2018

(51) Int. Cl.

*H01L 23/48* (2006.01)
*H01L 23/532* (2006.01)
*H01L 21/768* (2006.01)

(52) U.S. Cl.

CPC .. *H01L 23/53238* (2013.01); *H01L 21/76847* (2013.01); *H01L 21/76898* (2013.01); *H01L 23/481* (2013.01)

(58) Field of Classification Search

CPC ............. H01L 23/53238; H01L 23/481; H01L 23/76898; H01L 23/76843

USPC ........ 438/637, 643, 648, 653, 667; 257/751, 257/762, 767

See application file for complete search history.

(56) References Cited

U.S. PATENT DOCUMENTS

2003/0121608 A1* 7/2003 Chen ........................ C23C 16/34 156/345.33
2005/0179141 A1* 8/2005 Yun ................... H01L 21/28556 257/774
2009/0108452 A1* 4/2009 Nemoto .............. C23C 14/0641 257/751
2011/0124192 A1* 5/2011 Ganguli .................. C23C 16/18 438/653
2013/0037943 A1* 2/2013 Yamano .............. H01L 25/0657 257/737
2014/0048938 A1* 2/2014 Lee ..................... H01L 23/5384 257/751
2015/0035150 A1* 2/2015 Li ......................... H01L 23/481 257/747

OTHER PUBLICATIONS

Frety et al., "Copper Diffusion into Silicon Substrates through TaN and Ta/TaN Multilayer Barriers", Journal of Phase Equilibria and Diffusion, vol. 27, issue 6, laid open to the public Mar. 2006.*
Propkoshkin et al., "Nitriding of Tantalum", in Metal Science and Heat Treatment, vol. 26, issues 4-5, pp. 357-360, May 1984.*

* cited by examiner

*Primary Examiner* — Brook Kebede
(74) *Attorney, Agent, or Firm* — Perkins Coie LLP

(57) ABSTRACT

Semiconductor device interconnect structures comprising nitrided barriers are disclosed herein. In one embodiment, an interconnect structure includes a conductive material at least partially filling an opening in a semiconductor substrate, and a nitrided barrier between the conductive material and a sidewall in the opening. The nitrided barrier comprises a nitride material and a barrier material, such as tantalum, between the nitride material and the sidewall of the substrate.

23 Claims, 6 Drawing Sheets

INTERCONNECT STRUCTURE WITH NITRIDED BARRIER

TECHNICAL FIELD

The present technology relates to semiconductor device interconnect structures, including through-silicon interconnect structures, having a nitrided barrier.

BACKGROUND

Packaged semiconductor dies, including memory chips, microprocessor chips, and imager chips, typically include one or more semiconductor dies mounted on a package substrate and encased in a plastic protective covering. Each semiconductor die includes an integrated circuit and bond pads electrically connecting the integrated circuit to a plurality of wirebonds. The wirebonds are coupled to the package substrate, and, in turn, the package substrate electrically routes signals between the die and a printed circuit board connected to off-chip electrical devices.

Some die packages have through-silicon vias (TSVs) in lieu of wirebonds. A TSV extends through a hole in the substrate of the die. The TSV can electrically connect the die (or another die stacked on top of the die) to the package substrate. TSVs can reduce the package footprint and improve electrical performance.

When forming TSVs, a barrier material is deposited on the sidewall of the hole containing the TSV. The barrier material adheres the bulk material of the TSV, such as copper, to the sidewall and prevents electromigration of the bulk material into the substrate sidewall. One challenge with barrier materials is that they are prone to expand and contract more than the silicon material of the substrate during the manufacturing process. The difference in the expansion and contraction between the barrier materials and the silicon material can lead to delamination of the barrier material along with the TSV from the sidewall of the hole containing the TSV.

DETAILED DESCRIPTION

Specific details of several embodiments of semiconductor device assemblies having an interconnect structure with a nitrided barrier are described below. In various embodiments described below, the interconnect structure includes a conductive material surrounded by a nitrided barrier in an opening in a semiconductor substrate. The nitrided barrier is formed by first depositing a barrier material under vacuum over a sidewall in the opening. A process gas is subsequently flowed over a surface of the barrier material without breaking the vacuum. The process gas includes reactive nitrogen that diffuses through and reacts with the barrier material to form a nitride material of the nitrided barrier. The conductive material is then deposited over the nitrided barrier.

The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
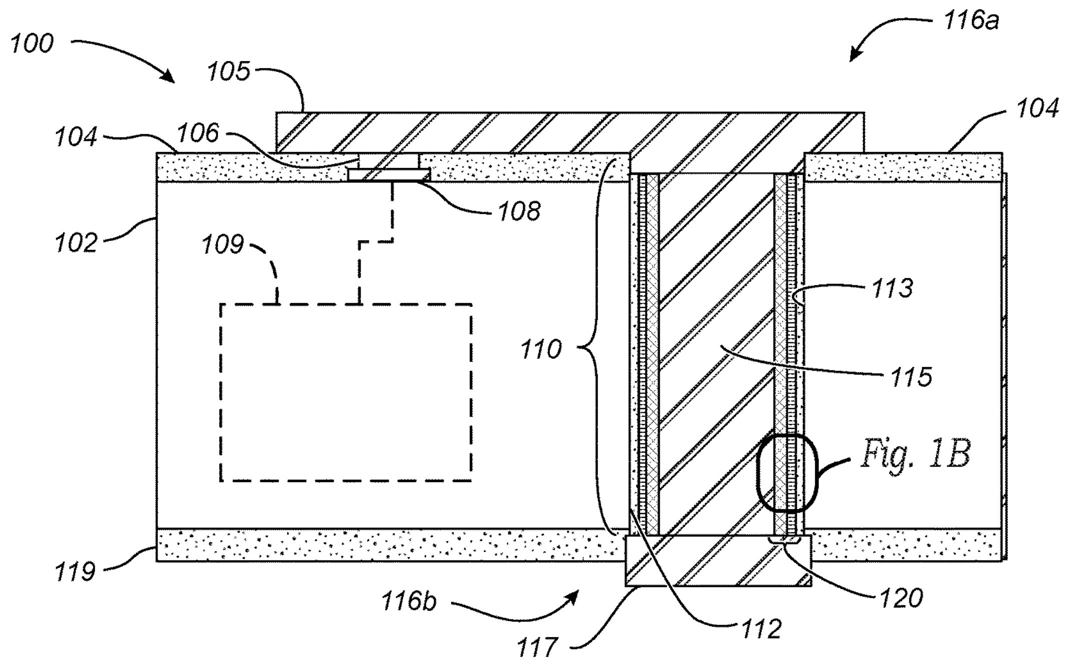
FIG. 1A is a cross-sectional view.

FIG. 1A is a cross-sectional view showing a semiconductor device 100 comprising an interconnect structure, such as a TSV 110, configured in accordance with an embodiment of the present technology. Referring first to FIG. 1A, the semiconductor device 100 includes a substrate 102, a passivation material 104 over the substrate 102, and a conductive trace 105 over a portion of the passivation material 104 and connected to the TSV 110. The substrate 102 includes a first side 116*a* (e.g., a top side), a second side 116*b* (e.g., a bottom side), and an opening 112 defined by a sidewall 113 extending between the first and second sides 116*a* and 116*b*. The TSV 110 is positioned in the opening 112 and separated from the sidewall 113 by a nitrided barrier 120, as described in greater detail below. The trace 105 extends laterally across the passivation material 104 at the first side 116*a* of the substrate 102 to connect the TSV 110 with a conductive via 106. The via 106, in turn, extends vertically through the passivation material 104 to connect the trace 105 to a buried substrate pad 108, and the substrate pad 108 operably connects the via 106 to an integrated circuit component 109 (shown schematically) within the substrate 102, such as a memory circuit, a logic circuit, an LED, or other circuit component. In some embodiments, the trace 105 can couple the TSV 110 to an overlying semiconductor die (not shown) in a stacked die arrangement.

As further shown in FIG. 1A, the TSV 110 includes a conductor 115 (e.g., a copper conductor) that connects the trace 105 with a lower contact pad 117 located at the second side 116*b* of the substrate. In some embodiments, the lower contact pad 117 can couple the TSV 110 to an electrical contact at a lower level in a device package (not shown). For example, the lower contact pad 117 can couple the TSV 110 to a contact pad on an underlying package substrate (not shown) or a contact pad on an underlying semiconductor die (not shown) in a stacked die arrangement. The lower contact pad 117 can extend through a portion of a passivation material 119 extending over the substrate at the second side 116*b*.

Figure 1B:
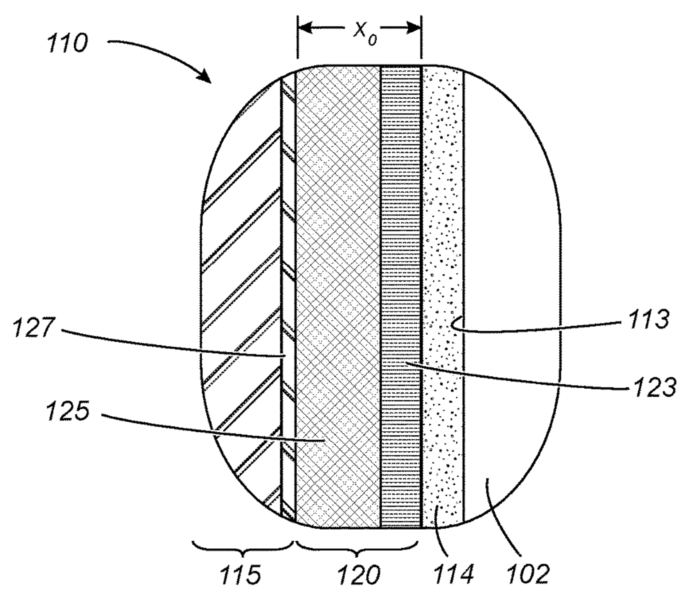
FIG. 1B is an enlarged view of FIG. 1A, showing a portion of a semiconductor device having an interconnect structure configured in accordance with embodiments of the present technology.

FIG. 1B is an enlarged view of a portion of the TSV 110 (FIG. 1A). The TSV 110 includes an insulator material 114 (e.g., silicon oxide) lining the sidewall 113 of the opening 112 and a nitrided barrier 120 on the insulator material 114. The nitrided barrier 120 can include a barrier material 123 (e.g., tantalum) directly on the insulator material 114 and a nitride material 125 ("nitride 125), such as tantalum nitride, lining the barrier material 123. In some embodiments, the conductor 115 can include a seed material 127 formed on the nitride 125 to seed formation of the conductor 115. In some embodiments described below, the barrier material 123 can be omitted from the TSV 120. In such embodiments, the nitride 125 can be directly on the insulator material 114. In these and other embodiments described below, the nitride 125 can be formed without physical vapor deposition (PVD) of the nitride 125, which can increase the uniformity of a thickness $x_0$ of the nitrided barrier 120 compared to conventional nitrided barriers formed from physically deposited nitrides.

Figure 2:
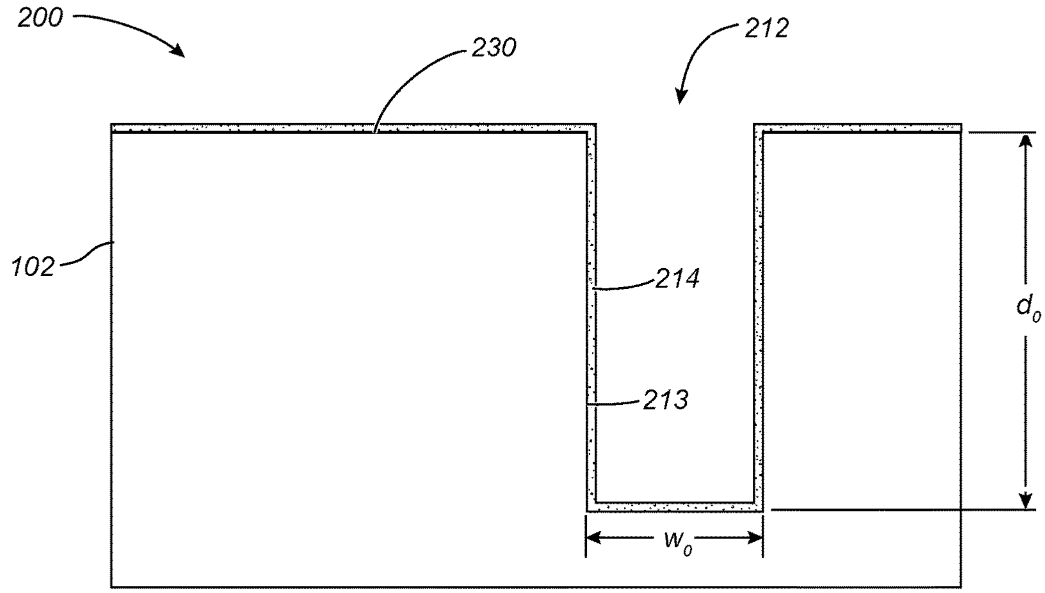
FIGS. 2-7 are cross-sectional views showing a semiconductor device at various stages of a method for making interconnect structures in accordance with embodiments of the present technology.

FIGS. 2-6 are cross-sectional views showing a semiconductor device 200 at various stages of a method for making interconnect structures in accordance with embodiments of the present technology. FIG. 2 shows the semiconductor device 200 having an opening, or blind hole 212, formed in an upper surface 230 of the semiconductor substrate 102, and an insulator material 214 deposited on a sidewall 213 in the hole 212. The hole 212 can be formed, for example, by an etch, such as a reactive ion etch. In some embodiments, the hole 212 can have a width $w_0$ in a range between about 1.5 μm and 5 μm (e.g., 2 μm), and a depth $d_0$ measured from the top surface of the substrate 102 in a range between about 30 μm and 50 μm (e.g., 40 μm). In these and other embodiments, the hole 212 can have an aspect ratio ($d_0$:$w_0$) in a range between about 4:1 to 25:1 (e.g., 6:1, 8:1, 12:1, 20:1).

The insulator material 214 can be a chemical vapor deposition (CVD) film, such as tetraethyl orthosilicate (TEOS), or an atomic layer deposition film (ALD), such as a thin ALD film of silicon oxide or a thin ALD film of silicon nitride, having a thicknesses that is less than, e.g., 0.1 μm. In other embodiments, the insulator material 214 can include other types of material, such as a low-k dielectric, a high-k dielectric, and/or a polymer. In some embodiments, the insulator material 214 can be doped, annealed, and/or otherwise treated (e.g., surface-roughened) to modify its dielectric properties.

Figure 3:
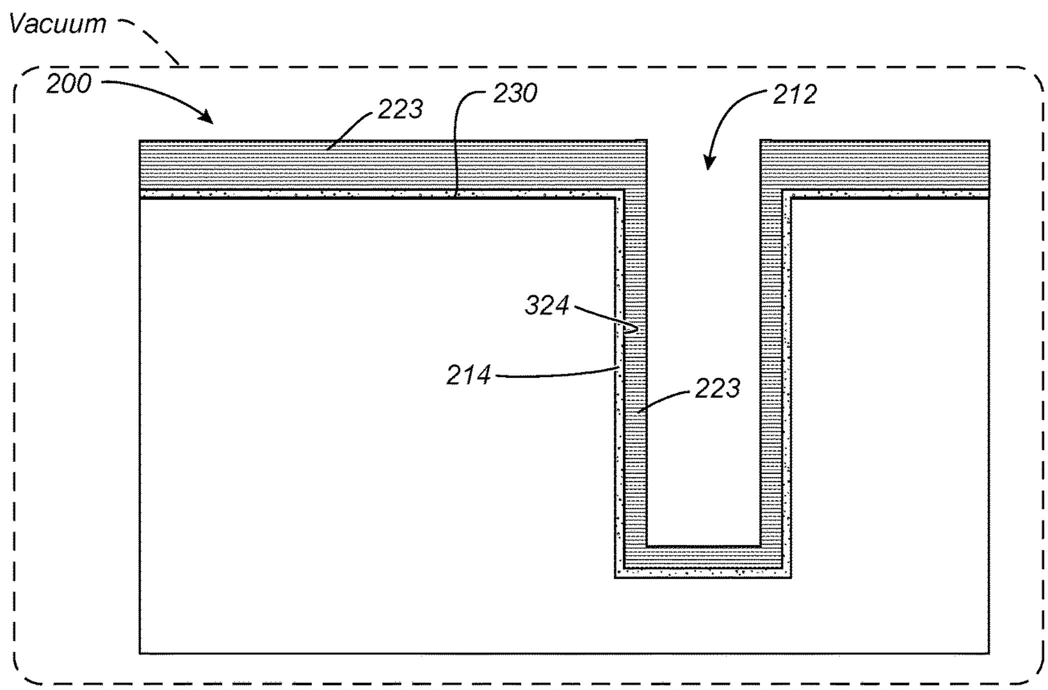

FIG. 3 shows the semiconductor device 200 after depositing an unnitrided barrier material 223 on the insulator material 214. The unnitrided barrier material 223 can be deposited using PVD, such as sputter deposition, or other suitable deposition techniques. The unnitrided barrier material 223 is deposited under vacuum (i.e., below atmospheric pressure). As described below, the vacuum is not broken until formation of a nitrided barrier is completed. In some embodiments, the unnitrided barrier material 223 can getter moisture (e.g., water) at an outer surface 324 of the insulator material 214 to promote adhesion.

In some embodiments, the unnitrided barrier material 223 comprises tantalum. In such embodiments, a thickness of the tantalum in the hole 212 can be in a range from about 10 Å and 40 Å (e.g., from about 20 Å and 30 Å).

In other embodiments, the unnitrided barrier material 223 comprises another material, such as titanium, suitable for forming a nitrided barrier. In various embodiments, a barrier material comprising titanium can have a thickness in the hole 212 in a range from about 15 Å and 60 Å (e.g., between about 30 Å and 50 Å). In general, tantalum-based barriers may provide better electrical isolation than a titanium-based barriers of equal thickness. Titanium-based barriers, on the other hand, may provide better adhesion than tantalum-based barriers. In some embodiments, the unnitrided barrier material 223 can comprise a combination of titanium and tantalum. The thickness of the unnitrided barrier material 223 can vary depending on the aspect ratio of the hole 212. In general, the unnitrided barrier material 223 is thinner inside the hole 212 than outside the hole 212.

Figure 4:
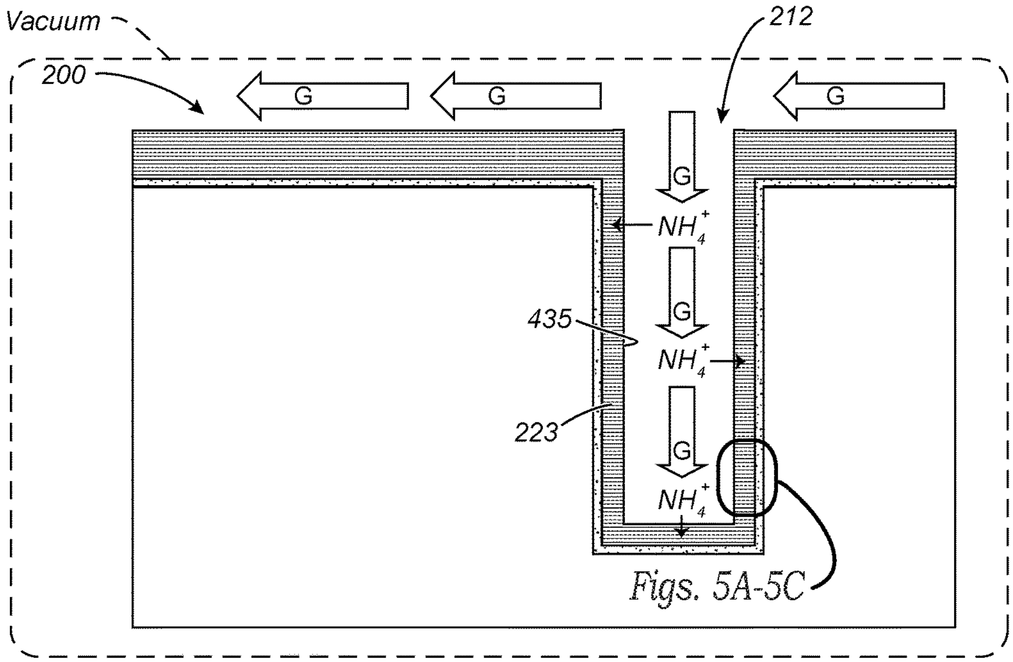

FIG. 4 shows the semiconductor device 200 during exposure to a process gas (represented by arrows G) without breaking the vacuum applied at the stage shown in FIG. 3. The process gas G includes reactive nitrogen, such as ionized ammonia ($NH_4^+$), that is flowed in hole 212 and across an exposed surface 435 of the unnitrided barrier material 223. In additional or alternate embodiments, the reactive nitrogen can include non-ionized ammonia ($NH_3$), heated nitrogen ($N_2$), and/or other reactive species, such as anion nitrate ($NO_3$). In some embodiments, the semiconductor device 200 can be exposed to an in-situ ammonia plasma treatment of reactive nitrogen in the same processing chamber (not shown) used to deposit the unnitrided barrier material 223. In other embodiments, the semiconductor device 200 can be moved to a different process chamber (not shown) for exposing the unnitrided barrier material 223 to the process gas G. For example, the semiconductor device 200 can be moved to the other processing station through a transfer station (not shown) that is held under vacuum.

In various embodiments, a nitrided barrier (not shown in FIG. 4) can be formed by the reaction of the unnitrided barrier material 223 with the reactive nitride of the process gas G, and without physical deposition of a nitride material, such as conventional sputter-deposition of titanium nitride. One challenge with conventional sputter-deposition of nitride material is that the nitrogen can dissociate from the constituent material (e.g., titanium) as it strikes the base of a hole and the adjacent sidewalls. A related challenge is that dissociation can be significant when forming TSVs and similar interconnect structures having relatively high aspect ratios (e.g., aspect ratios greater than 4:1) due to the increased energy imparted to the material near the base of the hole. As a result, sputter-deposited nitrides used in such conventional TSVs and interconnects can have large variations in thickness, particularly near the base of the hole. For example, some areas of the deposited nitride may become too thick as atomic nitrogen is backsputtered and re-deposited on portions of the sidewall near the base of hole, while other areas of the nitride may be too thin, or the nitride may not form at all in certain areas due to backsputtering. In some cases, non-uniform film coverage can cause poor adhesion and delamination of a TSV or interconnect. In these and other cases, thin areas of the nitride material may be prone to leakage and/or create electromigration paths that can reduce electrical performance.

Nitrided barriers configured in accordance with various embodiments of the present technology, however, can address these and other limitations of conventional techniques for forming nitrided barriers in TSVs and related interconnect structures. For example, the process gas G provides reactive nitrogen species that react with the unnitrided barrier material 223 to form the nitride material, such as the nitride material 125 (FIG. 1B). The resultant nitride material is substantially uniform in thickness because it is not sputter deposited, and the diffusion of the reactive nitrogen into the unnitrided barrier material 223 is generally anisotropic. In various embodiments, the uniform nitride material can promote adhesion of a conductor, such as the conductor 15 (FIG. 1B). In these and other embodiments, the uniform nitride material can reduce or prevent parasitic conduction and electromigration and/or alleviate stresses caused by thermal expansion/contraction of the materials in the hole 212. Although the nitride material is formed without sputter deposition, the barrier material 232 can be physically deposited because it does not include molecular nitride, which makes the barrier material 232 less prone to back-sputter. As described below, the thickness of the nitride material formed in the hole 212 can correspond to the duration of time that the process gas is flowed over the unnitrided barrier material 223.

Figure 5A:
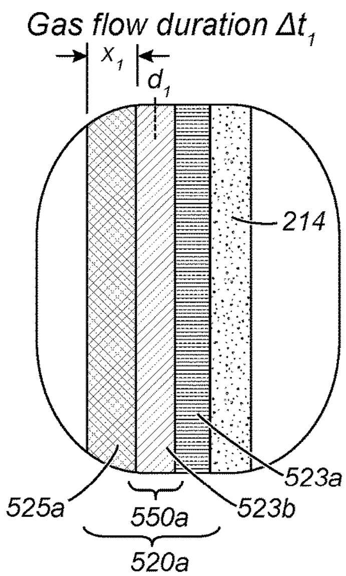

FIG. 5A, for example, shows a first nitride material 525*a* ("first nitride 525*a*") formed by flowing the process gas G (FIG. 4) for a first duration of time $\Delta t_1$ selected to react an outer portion of the unnitrided barrier material 223 (FIG. 4) with the reactive nitrogen of the process gas G. The first duration of time $\Delta t_1$ can be selected to fully convert a portion of the barrier unnitrided material 223 over a first thickness $x_1$ of the first nitride 525*a*. The first nitride 525*a* and a remaining portion of the unnitrided barrier material 223 form a first nitrided barrier 520*a*. The remaining portion of the unnitrided barrier material 223 includes an amount of substantially unreacted barrier material 523*a*, and a partially reacted amount of barrier material 523*b* between the unreacted barrier material 523*a* and the first nitride 525*a*. In various embodiments, some of the reactive nitrogen of the process gas G can diffuse through the first nitride 525*a* and deeper into the first nitrided barrier 520*a* to form an intermediary material, or intermediary region 550*a*. The intermediary region 550*a* includes a variable amount of nitride distributed throughout the partially reacted barrier material 523*b*. In general, the intermediary region 550*a* can have a greater concentration of nitride material (e.g., tantalum nitride) toward the fully-reacted first nitride 525*a*, and a lesser concentration of nitride material toward the insulator material 214. In some embodiments, the intermediary region 550*a* can be configured to have a 50/50 concentration of nitride/barrier material (e.g., tantalum nitride/tantalum) at a predetermined depth $d_1$ in the partially reacted barrier material 523*b*. In various embodiments, the predetermined depth $d_1$ can be an average depth of diffusion that is calculated based on the first duration of time $\Delta t_1$, the processing temperature, the properties of the unnitrided barrier material 223, the diffusion length of the reactive nitrogen of the process gas G, etc.

In various embodiments, the intermediary region 550*a* can be a junction of graded barrier/nitride configured to reduce stress and/or optimize adhesion between materials. For example, the predetermined depth $d_1$ can be selected such that the intermediary region 550*a* provides a gradual lattice transition between the first nitride 525*a* and the unreacted barrier material 523*a*. In some embodiments, a gradual lattice transition can alleviate stresses caused by a disparity in coefficient of thermal expansion (CTE) between materials during thermal cycling (e.g., annealing).

Figure 5B:
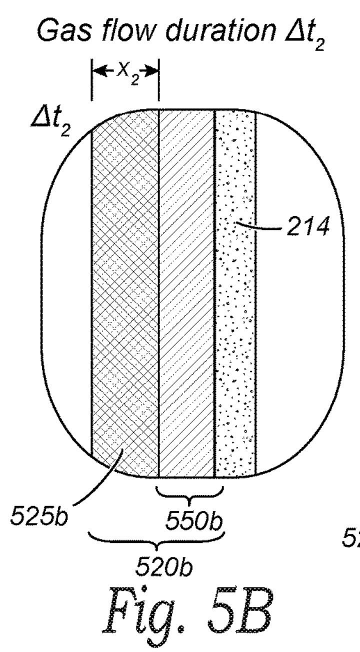
Figure 5C:
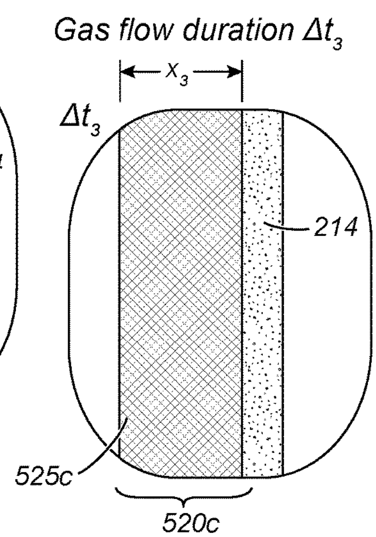

FIGS. 5B and 5C show second and third nitrided barriers 520*b* and 520*c*, respectively, which can be formed as an alternative to the first nitrided barrier 520*a* shown in FIG. 5A. Referring to FIG. 5B, for example, the unnitrided barrier material 223 (FIG. 4) is exposed to the process gas G (FIG. 4) for a second duration of time $\Delta t_2$ greater than the flow time $\Delta t_1$ of the process gas G shown in FIG. 5A. The reactive nitrogen of the process gas G forms a second nitride material 525*b* ("second nitride 525*b*). The second nitride 525*b* can have the same or a substantially similar composition as the first nitride 525*a* (FIG. 5A), but has a greater thickness $x_2$ due to the deeper diffusion of reactive nitrogen into the second nitrided barrier 520*b*. In the example illustrated in FIG. 5B, some of the reactive nitrogen diffuses to the insulator material 214, and all of the unnitrided barrier material 223 has at least partially reacted with the reactive nitrogen of the process gas G. The partially reacted nitrogen can form an intermediary region 550*b* in the second nitrided barrier 520*b* that is similar in composition to the intermediary region 550*a* shown in FIG. 5A, but is expanded such that it directly interfaces with the insulation material 214.

Referring to FIG. 5C, the unnitrided barrier material 223 (FIG. 4) is exposed to the process gas G (FIG. 4) for a third duration of time $\Delta t_3$ greater than the second duration of time $\Delta t_2$ shown in FIG. 5B. In the example illustrated in FIG. 5C, all of the unnitrided barrier material 223 has fully reacted with the reactive nitrogen to form a third nitride material 525*c* ("third nitride 525*c*"). Accordingly, there is no intermediary region between the third nitride 525*c* and the insulator material 214 because all of the unnitrided barrier material 223 has been consumed by the reaction. Accordingly, the third nitride 525*c* if fully expanded and directly interfaces with the insulation material 214.

Figure 6:
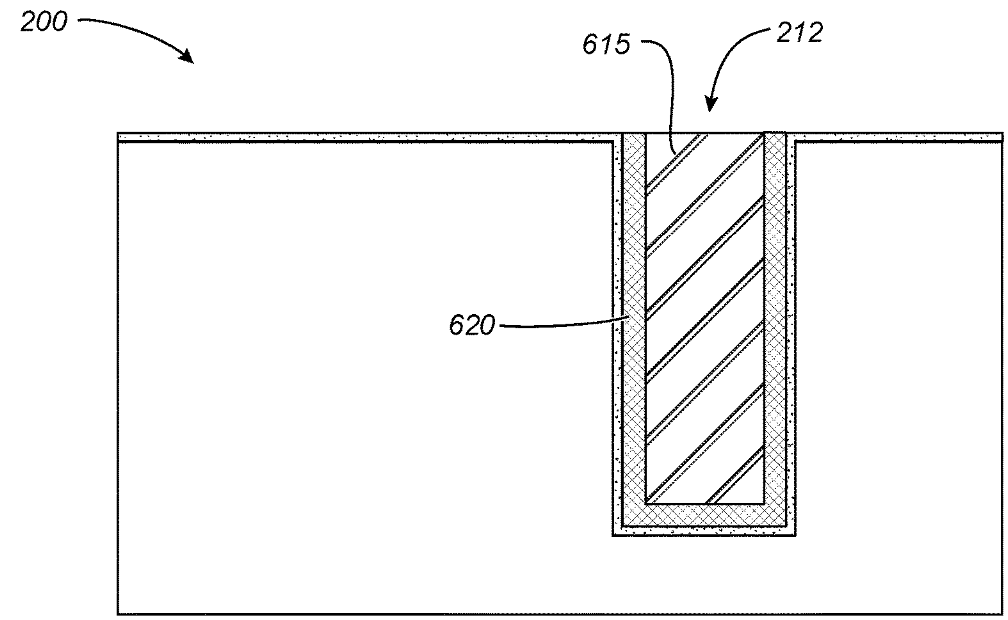
Figure 7:
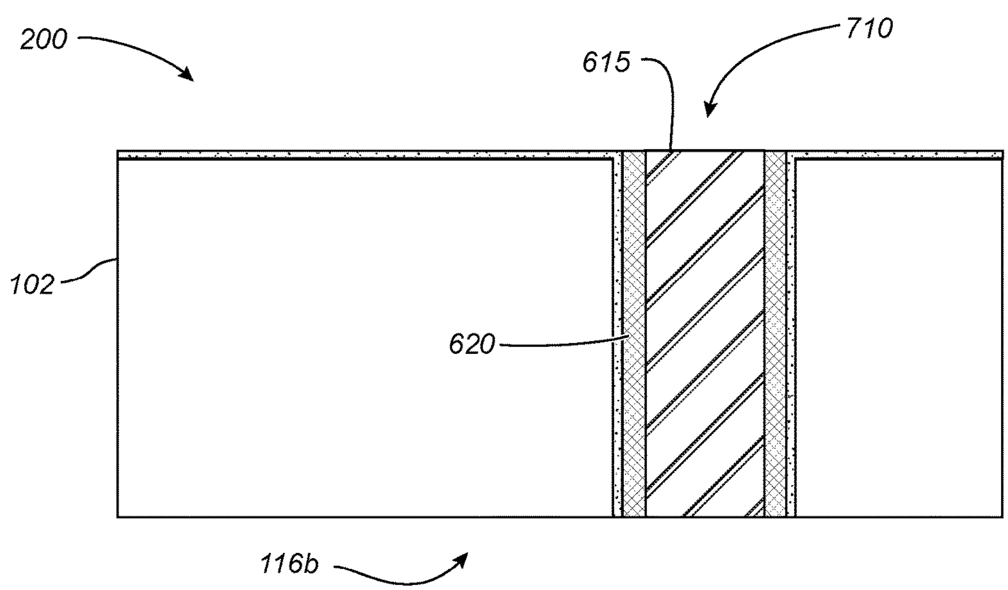

FIG. 6 shows the semiconductor device 200 after depositing a conductor 615 (e.g., a copper conductor) in the hole 212 over a nitrided barrier 620, such as one of the nitrided barriers 520*a*-520*c* of FIGS. 5A-5C, respectively. As shown in FIG. 6, upper portions of the deposited materials are removed down to the portion of the insulator on the substrate 102 or even to a top surface of the substrate 102. FIG. 7 shows the semiconductor device 200 after thinning (e.g., backgrinding) the substrate 102 at the second side 116*b* to complete an interconnect structure 710 (e.g., a TSV) defined by the combination of the conductor 615 and the nitrided barrier 620. Once thinned, the conductor 616 can be exposed at the second side 116*b* of the substrate 102.

Figure 8A:
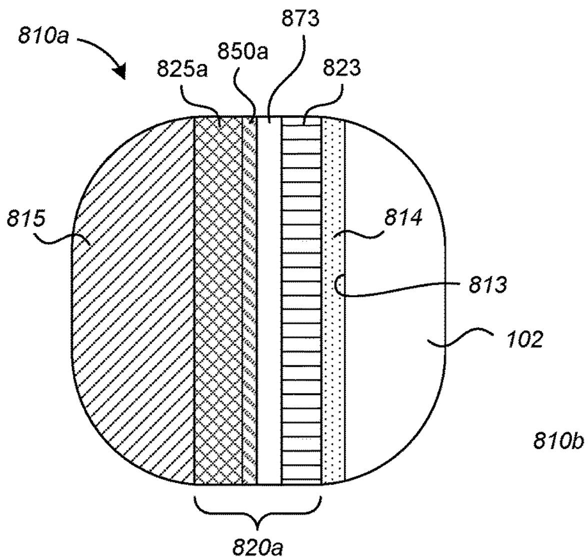
FIGS. 8A-8C are enlarged, cross-sectional views of portions of interconnect structures configured in accordance with embodiments of the present technology.
Figure 8B:
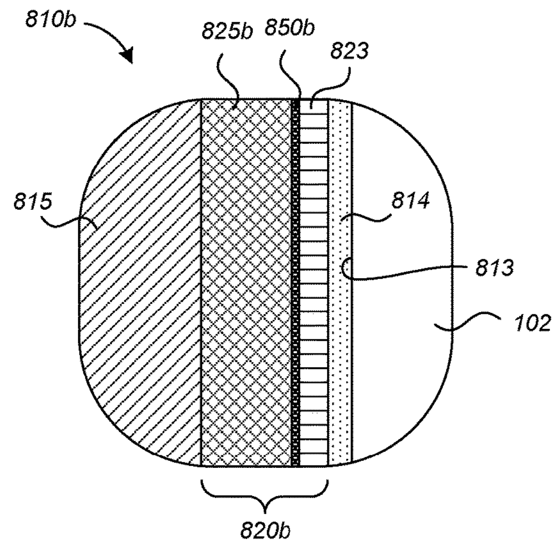
Figure 8C:
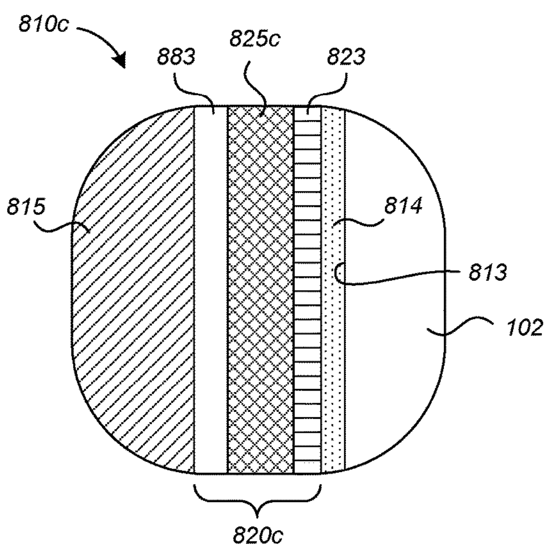

FIGS. 8A-8C show enlarged, cross-sectional views of portions of interconnect structures, such as TSVs 810*a*-810*c*, respectively, configured in accordance with embodiments of the present technology. The TSVs 810*a*-810*c* can be generally similar to the TSVs described above. For example, each of the TSVs 810*a*-810*c* includes a nitrided barrier 820*a*-820*c*, respectively, between a conductor 815 (e.g., a copper conductor) and an insulator material 814 on a sidewall 813 of the substrate 102. Each of the nitrided barriers 820*a*-820*c* can include a barrier material 823 similar in structure and composition to the barrier materials described above. For example, in one embodiment, the barrier material 823 can be titanium. Referring to FIG. 8A, the TSV 810*a* includes an additional barrier material 873 (e.g., tantalum) between the barrier material 823 and a nitride material 825*a* (e.g., tantalum nitride). The nitrided material 825*a* can be formed by diffusing reactive nitride (not shown; e.g., ionized ammonia) into the nitride barrier 820*a* to react with the additional barrier material 873. In some embodiments, the additional barrier material 873 can be partially consumed to form an intermediary region 850*a* between the barrier material 823 and the nitride material 825*a*, as described above.

FIG. 8B shows a nitride material 825*b* that has been formed by fully reacting the additional barrier material 873 (FIG. 8A) with reactive nitrogen (not shown). In some embodiments, the nitride material 825*b* can include a fully or partially reacted portion of the adjacent barrier material 823 overlying the insulator material 814. For example, the remaining barrier material 823 can include an intermediary region 850*b*, as described above. FIG. 8C shows an additional barrier material 883 (e.g., tantalum) formed between the nitrided barrier 820*c* (e.g., titanium nitride) and the conductor 815. In some embodiments, TSVs and related interconnect structures configured in accordance with the various embodiments of the present technology can include one of the nitride materials 825*a-c* combined with both of the additional barrier materials 873 and 883. In these and other embodiments, one or both of the additional barrier materials 873 and 883 can be incorporated into a TSV to enhance adhesion, electrical isolation, and/or thermal matching between the conductor 815 and the insulator material 214 over the sidewall 213. In such embodiments, one or both of the additional barrier materials can be deposited via PVD (e.g., sputter deposition).

Figure 9:
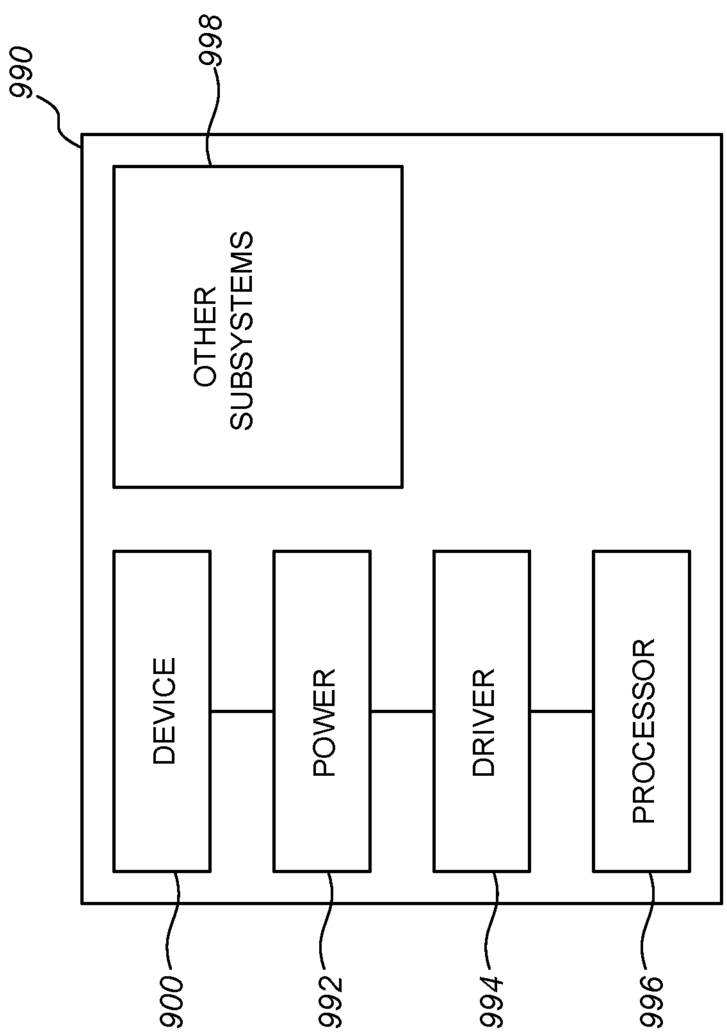
FIG. 9 is a schematic view of a system that includes a semiconductor device having an interconnect structure configured in accordance with embodiments of the present technology.

Any one of the interconnect structures and/or semiconductor devices described above with reference to FIGS. 1A-8C can be incorporated into any of a myriad of larger and/or more complex systems, a representative example of which is system 990 shown schematically in FIG. 9. The system 990 can include a semiconductor device 900, a power source 992, a driver 994, a processor 996, and/or other subsystems or components 998. The semiconductor device 900 can include features generally similar to those of the stacked semiconductor die assemblies described above, and can therefore include one or more of the interconnect structures of the various embodiments. The resulting system 990 can perform any of a wide variety of functions, such as memory storage, data processing, and/or other suitable functions. Accordingly, representative systems 990 can include, without limitation, hand-held devices (e.g., mobile phones, tablets, digital readers, and digital audio players), computers, and appliances. Components of the system 990 may be housed in a single unit or distributed over multiple, interconnected units (e.g., through a communications network). The components of the system 990 can also include remote devices and any of a wide variety of computer readable media.

From the foregoing, it will be appreciated that specific embodiments of the technology have been described herein for purposes of illustration, but that various modifications may be made without deviating from the disclosure. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:

forming an opening in a semiconductor substrate, wherein the semiconductor substrate includes a sidewall in the opening; and forming an interconnect structure at least within the opening, wherein forming the interconnect structure includes:

depositing under vacuum a first barrier material over the sidewall of the semiconductor substrate, wherein the first barrier material comprises titanium, depositing under vacuum a second barrier material over the first barrier material, wherein the second barrier material comprises tantalum, forming a nitride material from the second barrier material, wherein forming the nitride material includes flowing a process gas comprising reactive nitrogen over a surface of the second barrier material without breaking the vacuum, and wherein the second barrier material is deposited over the first barrier material before flowing the process gas, and depositing a conductive material within a volume defined by the nitride material.

2. The method of claim 1 wherein forming the interconnect structure further includes forming an intermediary material between the nitride material and the sidewall of the semiconductor substrate, wherein flowing the process gas includes flowing the process gas such that reactive nitrogen diffuses through the nitride material into at least one of a portion of the second barrier material and a portion of the first barrier material.

3. The method of claim 2 wherein the intermediary material comprises tantalum and tantalum nitride, and wherein the nitride material consists essentially of tantalum nitride.

4. The method of claim 2 wherein the intermediary material comprises titanium and titanium nitride.

5. The method of claim 1 wherein flowing the gas includes flowing the gas such that reactive nitrogen diffuses over an entire thickness of at least one of the first barrier material and the second barrier material.

6. The method of claim 1 wherein flowing the process gas includes flowing the process gas such that reactive nitrogen diffuses through the nitride material into at least one of a portion of the first barrier material and a portion of the second barrier material to form an intermediary region, wherein the intermediary region comprises a graded concentration of nitrided and unnitrided materials.

7. The method of claim 1, further comprising depositing an insulator material over the sidewall of the semiconductor substrate, wherein depositing the second barrier material includes depositing the second barrier material over the insulator material.

8. The method of claim 1 wherein the second barrier material further comprises titanium, and wherein the nitride material comprises at least one of tantalum nitride and titanium nitride.

9. The method of claim 1 wherein the nitride material consists essentially of tantalum nitride, and wherein depositing the conductive material includes depositing the conductive material onto the tantalum nitride.

10. The method of claim 9 wherein depositing the conductive material includes depositing tantalum onto the tantalum nitride.

11. The method of claim 9 wherein depositing the conductive material includes depositing copper onto the tantalum nitride.

12. The method of claim 1 wherein the reactive nitrogen of the process gas comprises ionized ammonia.

13. A method of forming a through-silicon via (TSV), the method comprising:

forming an opening in a semiconductor substrate;

depositing a first unnitrided barrier material at least within the opening, wherein the first unnitrided barrier material comprises titanium;

depositing a second unnitrided barrier material over the first unnitrided barrier material, wherein the second unnitrided barrier material comprises tantalum, and wherein the second unnitrided barrier material has an exposed surface within the opening;

flowing a gas comprising reactive nitrogen to the exposed surface of the second unnitrided barrier to react the second unnitrided barrier material with the reactive nitrogen, wherein the second unnitrided barrier material is deposited over the first unnitrided barrier material before flowing the gas; and at least partially filling the opening with a conductive material after flowing the gas.

14. The method of claim 13 wherein the second unnitrided barrier material consists essentially of tantalum, and wherein the method further comprises diffusing the reactive nitrogen into the tantalum to form tantalum nitride.

15. The method of claim 13 wherein the first unnitrided barrier material consists essentially of titanium, and wherein the method further comprises diffusing the reactive nitrogen into the titanium to form titanium nitride.

16. The method of claim 13, further comprising forming an intermediary material between the nitrided barrier and a portion of the second unnitrided barrier material.

17. The method of claim 13 wherein the second unnitrided material further comprises titanium, and wherein the method further comprises diffusing the reactive nitrogen into the titanium to form titanium nitride.

18. A semiconductor device, comprising:

a semiconductor substrate having a surface, an opening in the surface, and a sidewall in the opening; and an interconnect structure at least within the opening, wherein the interconnect structure includes:

a conductive material at least partially filling the opening, and a nitrided barrier between the sidewall and the conductive material, wherein the nitrided barrier comprises:

a nitride material;

a first barrier material between the nitride material and the sidewall of the semiconductor substrate, wherein the first barrier material consists essentially of tantalum; and a second barrier material between the first barrier material and the sidewall of the semiconductor substrate, wherein the second barrier material comprises titanium.

19. The semiconductor device of claim 18 wherein the nitride material consists essentially of tantalum nitride.

20. The semiconductor device of claim 19 wherein the nitrided barrier further comprises an intermediary region between the first barrier material and the nitride material, wherein the intermediary region comprises a graded concentration of tantalum and tantalum nitride.

21. The semiconductor device of claim 18 wherein the nitride material consists essentially of titanium nitride.

22. The semiconductor device of claim 18 wherein the interconnect structure includes a through-silicon via.

23. The semiconductor device of claim 18 wherein the semiconductor substrate comprises a memory circuit operably coupled to the interconnect structure.

* * * * *